United States Patent [19]
Li et al.

[11] Patent Number: 6,103,571
[45] Date of Patent: Aug. 15, 2000

[54] METHOD FOR FORMING A DRAM CAPACITOR HAVING IMPROVED CAPACITANCE AND DEVICE FORMED

[75] Inventors: M. Y. Li; L. C. Chen; Y. J. Mii, all of Hsin-Chu, Taiwan

[73] Assignee: Taiwan Semiconductor Manufacturing Company, Ltd., Hsin Chu, Taiwan

[21] Appl. No.: 09/070,540

[22] Filed: Apr. 30, 1998

[51] Int. Cl.[7] .................................................. H01L 21/8242
[52] U.S. Cl. ........................ 438/255; 438/253; 438/396; 438/398; 438/690; 438/964
[58] Field of Search ..................................... 438/244, 253, 438/254, 255, 387, 396, 397, 398, 690, 723, 964, 665, 692, 959; 257/306, 307, 308, 309

[56] References Cited

U.S. PATENT DOCUMENTS 5,573,973   11/1996   Sethi et al. ............................... 438/386
5,879,988   3/1999    Chen et al. ............................... 438/254
5,937,294   8/1999    Sandhu et al. .......................... 438/255

FOREIGN PATENT DOCUMENTS 4-218958   8/1992   Japan ............................ H01L 27/108
6-085195   3/1994   Japan ............................ H01L 27/108

*Primary Examiner*—Carl Whitehead, Jr.
*Assistant Examiner*—Toniae M. Thomas
*Attorney, Agent, or Firm*—Tung & Associates

[57] ABSTRACT

The present invention discloses a method for forming a DRAM capacitor that has improved charge capacitance which can be carried out by first depositing an oxide layer on a semiconducting substrate, forming an uneven surface on the oxide layer, forming a capacitor node in the oxide layer to expose the substrate, depositing a polysilicon layer on top of the oxide layer and in the node such that the uneven surface on the oxide layer is substantially reproduced in a top surface of the polysilicon layer, depositing a dielectric layer and a second polysilicon layer sequentially on top of the first polysilicon layer to reproduce the uneven surface on the oxide layer, and then defining the DRAM capacitor.

20 Claims, 2 Drawing Sheets

METHOD FOR FORMING A DRAM CAPACITOR HAVING IMPROVED CAPACITANCE AND DEVICE FORMED

FIELD OF THE INVENTION

The present invention generally relates to a method for forming a dynamic random access memory (DRAM) capacitor and capacitor formed and more particularly, relates to a method for forming a DRAM capacitor which has improved capacitance by first depositing an oxide layer on a semiconducting substrate and then forming an uneven surface on the oxide layer and a capacitor node before layers of polysilicon and dielectric materials are deposited for forming the capacitor and capacitor which has improved capacitance formed by such method.

BACKGROUND OF THE INVENTION

A typical DRAM cell includes a transistor and a storage capacitor. In the early DRAM cells, storage capacitors of the planar type were used which require the use of large wafer real estate. In recent years, as the size of IC devices is continuously miniaturized when smaller chips are made and more devices are packed into a chip, the circuit density on the chip increases to such an extent that the specific capacitance of a storage capacitor must be increased in order to meet such demand. Since chip real estate is limited, the only feasible way of increasing the specific capacitance of a storage capacitor is to increase it three-dimensionally, i.e., to grow the capacitor cell in the vertical dimension and forming a stacked capacitor.

A stacked capacitor can be built on top of a transistor thus allowing a smaller cell to be built without losing the specific capacitance of the cell. It has become a popular design for use in modern semiconductor memory devices to save chip real estate. Other approaches in increasing the cell capacitance, such as one that involves the formation of a deep trench for storing charges vertically, require complicated processing steps and are difficult to carry out.

In modern memory cells, where smaller dimension and higher specific capacitance are desirable characteristics, a DRAM capacitor can be formed by two layers of a semiconducting material and one layer of a dielectric material sandwiched therein. A suitable dielectric material utilized in such a capacitor includes a thin oxide layer or a composite oxide-nitride-oxide layer which is sandwiched between two semiconducting layers of polysilicon for forming the capacitor cell. The capacitor is frequently formed over a bit line on the surface of a silicon substrate.

A typical 16-Mb DRAM cell is shown in FIG. 1. The DRAM cell 10 has a stacked capacitor 20 built on top. The formation of the DRAM cell 10 can be accomplished by first using standard CMOS fabrication steps to form a transistor and to provide a gate oxide layer (not shown). A word line 12 is then formed by first depositing a polysilicon layer of approximately 2500 Å and then doping the polysilicon with phosphorous. A thick layer of insulating material 16 such as TEOS (tetraethoxy silicate) oxide of approximately 3,000 Å is then deposited on top of the first polysilicon layer. By using a standard photomasking process, the two layers are defined and etched by a plasma etching technique. After lightly doped drain (LDD) implants are made in the silicon substrate, oxide spacers are formed on the polysilicon gate structure by depositing a thick layer of TEOS oxide of approximately 2,000 Å and etching in a plasma process. Gates 12 and 14 are thus formed and covered by a thick oxide insulating layer 16. A source and drain mask is then applied to carry out an ion implantation process for forming the source and drain regions in the silicon substrate.

In the next fabrication step, photomasking is used to form openings for the cell contact and plasma etching is used to remove any native oxide layer on the silicon substrate. A second polysilicon layer 22 of approximately 3,500 Å is then deposited and patterned by a photomask to form the lower electrode of the stacked capacitor 20. A dielectric layer of a composite film of oxide-nitride-oxide (ONO) is deposited as the dielectric layer for the capacitor. The total thickness of the ONO composite film is approximately 70 Å. The ONO composite film can be formed by using a thin layer of native oxide as the first oxide layer, depositing a thin nitride layer on top and then oxidizing the nitride layer to grow a top oxide layer. To complete the fabrication of the stacked capacitor, a third polysilicon layer 24 of approximately 2,000 Å thick is deposited on top of the dielectric layer and then doped and patterned by a photomask to form an upper electrode. After the formation of the stacked capacitor, peripheral devices can be formed by masking and ion implantation, followed by the formation of a bit line 28 of a polysilicon/metal silicide material. A thick insulating layer 32 of BPSG or SOG is then deposited over the capacitor and reflowed to smooth out the topography and to reduce the step height. Other back-end-processes such as metallization to form metal lines 34 are used to complete the fabrication of the memory device 10.

The stacked capacitor 10 shown in FIG. 1 has been successfully used in 16 Mb DRAM devices. However, as device density increases to 256 Mb or higher, the planar surface required for building this type of conventional stacked capacitors becomes excessive and must be reduced.

Others have proposed a technique of forming DRAM stack capacitors by using a rugged polysilicon layer as the lower electrode in a capacitor cell. This is shown in FIG. 2. A semiconducting substrate 40 is presented which has a layer of a non-doped silicate glass 42 deposited on top. After the insulating layer 42 is patterned and etched in a conventional etching process, the substrate area 44 is exposed as the storage node capacitor cell contact. In the next processing step, a layer of polysilicon 46 is deposited and formed. The thickness of the polysilicon layer 46 is in the range between 400 Å and 600 Å. To increase the surface area of the polysilicon layer, a rugged surface polysilicon layer 48 is deposited at a relatively low deposition temperature of between 500° C. and 600° C. by a chemical vapor deposition technique. The deposition temperature of the rugged polysilicon must be kept low in order to maintain the wave-like surface texture of the rugged polysilicon. The thickness of the rugged polysilicon layer 48 is between 700 Å and 1000 Å. In a subsequent process, the polysilicon layer 46 and the rugged polysilicon layer 48 are patterned and etched to form a lower electrode of the capacitor cell. A second insulating layer, preferably of an oxide or an oxide-nitride-oxide insulating layer 50 is deposited by a chemical vapor deposition technique. After the second insulating layer 50 is patterned and etched to form a conformal layer on the capacitor cell, a final layer 52 of polysilicon is deposited by chemical vapor deposition and formed as the upper electrode in the capacitor cell.

A storage capacitor that has improved storage capacity can be fabricated by this process. However, the fabrication process is complicated since low temperature process must be carried out to form the rugged polysilicon layer. In a capacitor cell that incorporates rugged polysilicon, the device must not be subjected in a down-stream fabrication step that has a process temperature of more than 600° C. The high temperature would render the wave-like textured surface of the rugged polysilicon smooth and as a consequence, make it lose its increased storage capacity.

It is therefore an object of the present invention to provide a method for forming a DRAM capacitor that has improved storage capacity without the drawbacks and shortcomings of the conventional methods.

It is another object of the present invention to provide a method for forming a DRAM capacitor that has improved storage capacity which does not require the formation of a low temperature rugged polysilicon layer.

It is a further object of the present invention to provide a method for forming a DRAM capacitor that has improved storage capacity by first depositing an oxide layer on a semiconducting substrate and then forming an uneven surface on said oxide layer.

It is another further object of the present invention to provide a method for forming a DRAM capacitor that has improved storage capacity by first depositing an oxide layer on a semiconducting substrate, and then forming an uneven surface and a capacitor node in the oxide layer.

It is yet another object of the present invention to provide a method for forming a DRAM capacitor that has improved storage capacity by first depositing an oxide layer on a semiconducting substrate, forming an uneven surface and a capacitor node in the oxide layer, and then depositing sequentially layers of polysilicon and dielectric materials on top of the oxide layer and in the node forming the DRAM capacitor.

It is still another object of the present invention to provide a method for forming a DRAM capacitor that has improved storage capacity by first depositing an oxide layer on a semiconducting substrate and then forming an uneven surface on the oxide layer by a diamond abrasive paper.

It is still another further object of the present invention to provide a DRAM capacitor that has improved storage capacity by forming an uneven surface on an oxide layer and then reproducing such uneven surface on subsequently deposited polysilicon layers for achieving an increased surface area and resulting improved storage capacity.

It is yet another further object of the present invention to provide a DRAM capacitor that has improved storage capacity which incorporates an oxide layer which has an uneven surface formed by grooves juxtaposed to each other having a depth of at least 500 Å.

SUMMARY OF THE INVENTION

In accordance with the present invention, a method for forming a DRAM capacitor that has improved storage capacity and capacitors formed by such method are provided. In the method, a layer of oxide is first deposited on a semiconducting substrate and then formed into an uneven surface by mechanical means such that subsequently deposited polysilicon and dielectric layers on top of the oxide layer also produce such uneven surface and thus producing a capacitor having increased surface area and resulting increased charge capacity.

In a preferred embodiment, a method for forming a DRAM capacitor is provided which includes the operating steps of first depositing an oxide layer on a semiconducting substrate, forming an uneven surface in a top surface of the oxide layer, forming a capacitor node in the oxide layer exposing the substrate, depositing a polysilicon layer on top of the oxide layer and in the node such that the uneven surface on the oxide layer is substantially reproduced in a top surface of the polysilicon layer, depositing a dielectric layer and a second polysilicon layer sequentially on top of the first polysilicon layer, reproducing the uneven surface on the oxide layer, and then defining the DRAM capacitor.

The method may further include the step of defining the DRAM capacitor by an anisotropic etching process. The first and second polysilicon layers deposited can be suitably doped polysilicon. The first and second polysilicon layers deposited may have a thickness of between about 500 Å and about 8000 Å. The dielectric layer deposited is an oxide or an oxide-nitride-oxide material. The anisotropic etching process can be conducted by a reactive ion etching method or a plasma etching method. The anisotropic etching process may also be conducted by an etchant chemistry capable of etching both oxide and polysilicon layers. The anisotropic etching step may be conducted by a fluorine-based chemistry or a chlorine-based chemistry. The uneven surface on the oxide layer can be formed by a mechanical polishing method into grooves juxtaposed to each other. The grooves may have a depth, or a diameter of at least 500 Å. The grooves may be formed advantageously by polishing with a diamond abrasive paper in a single-stroke motion.

In another preferred embodiment, the present invention method for forming a DRAM capacitor which has improved capacitance can be carried out by the steps of first providing a semiconducting substrate, then depositing an oxide layer on the substrate, then forming an uneven surface on top of the oxide layer by a polishing method, then forming a capacitor node in the oxide layer, then depositing a first polysilicon layer, a dielectric layer, and a second polysilicon layer sequentially on the oxide layer and in the node such that the uneven surface on the oxide layer is reproduced in a top surface of the second polysilicon layer, and then reactive ion etching the polysilicon layers and the dielectric layer forming a DRAM capacitor which has improved capacitance.

The oxide layer can be deposited to a thickness of at least 1000 Å as an inter-poly oxide layer. The first and second polysilicon layers can be deposited with doped polysilicon. The dielectric layer deposited can be an oxide or an oxide-nitride-oxide material. The reactive ion etching process can be carried out in a plasma etching chamber. The first and second polysilicon layers deposited can be doped polysilicon which have a thickness of between about 500 Å and about 8000 Å. The uneven surface in the top surface of the oxide layer is formed by grooves juxtaposed to each other. The grooves may have a depth, or a diameter of at least 500 Å.

The present invention is further directed to a DRAM capacitor that has improved storage capacity including an oxide layer on a substrate which has a node formed therein and a substantially uneven top surface, a first polysilicon layer on top of the oxide layer and in the node reproducing the uneven surface, a dielectric layer on top of the polysilicon layer reproducing the uneven surface, and a second polysilicon layer on top of the dielectric layer reproducing the uneven surface whereby the substantially uneven surface in the first and second polysilicon layers improve the storage capacity of the capacitor. The substantially uneven surface of the oxide layer includes a multiplicity of grooves juxtaposed to each other. The first polysilicon layer and the second polysilicon layer are doped polysilicon each having a thickness between about 500 Å and about 8000 Å. The dielectric layer may be an oxide layer or an oxide-nitride-oxide layer that has a thickness between about 50 Å and about 200 Å. The substantially uneven top surface of the oxide layer includes a multiplicity of grooves juxtaposed to each other, each of the multiplicity of grooves has a depth, or a diameter of at least 500 Å.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for making a DRAM capacitor cell that has improved capacity by first forming an oxide layer on a semiconducting substrate and then producing an uneven surface on and a capacitor node in the oxide layer such that subsequently deposited polysilicon layers reproduce such uneven surface and thus gaining additional surface areas for achieving improved charge capacity and devices formed by such method. The uneven top surface on the oxide layer may be produced by mechanical means. One of such suitable mechanical means is by running a diamond abrasive paper once on a top surface of the oxide such that grooves juxtaposed to each other are produced. A suitable size of the grooves formed in the uneven top surface is at least 500 Å in diameter. After the top, uneven surface is formed on the oxide layer and the capacitor node is formed to expose the substrate, a first polysilicon layer, a dielectric layer, and a second polysilicon layer are sequentially deposited on top of the oxide layer and in the node to reproduce the uneven surface of the oxide layer. The uneven surface of the polysilicon layers contribute to an increased surface area and a resulting increased charge capacity for the subsequently formed capacitor cell.

In the final step of the process, the polysilicon layers and the dielectric layer are anisotropically etched to form the capacitor cell.

The uneven top surface on the oxide layer can be advantageously produced by using a diamond abrasive paper and polishing the oxide surface in a single stroke. Grooves of suitable size can be formed adjacent to each other on the oxide surface which has a depth, or diameter of at least 500 Å. A suitable range of the diameters of the grooves formed can be between about 500 Å and about 2000 Å. After the polysilicon layers and the dielectric layer are deposited on top of the oxide layer and thus reproduced the uneven surface of the oxide layer, an anisotropic etching process such as a reactive ion etching technique may be used to define and form the capacitor cell. A suitable etch chemistry utilizing a fluorine-type or a chlorine-type etchant can be used in the process. It is desirable that the etch chemistry should have a higher selectivity for the oxide layer such that the polysilicon layers and the dielectric layer can be readily etched away while the etch stops at the top surface of the oxide layer.

A fine grade of diamond abrasive paper can be used such that grooves having a depth of between about 500 Å and about 2000 Å can be produced on the surface of the oxide layer. The thickness of the oxide layer deposited on top of the semiconducting substrate should be in the range of between about 2000 Å and about 10000 Å, while the thickness of the polysilicon layer deposited for the electrode can be anywhere between about 500 Å and about 8000 Å.

Figure 1:
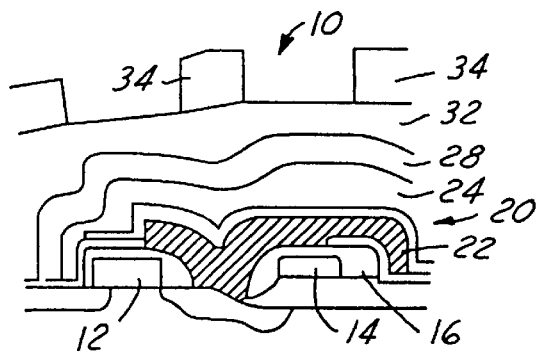
FIG. 1 is an enlarged, cross-sectional view of a conventional stacked capacitor DRAM cell.
Figure 2:
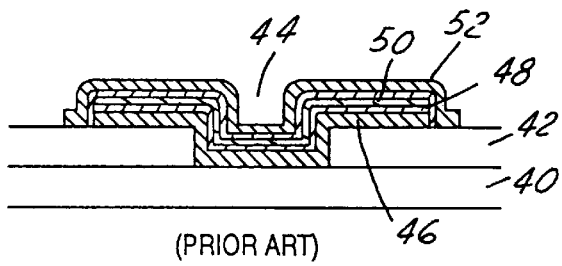
FIG. 2 is an enlarged, cross-sectional view of a conventional DRAM capacitor cell utilizing a rugged polysilicon layer as the lower electrode.
Figure 3:
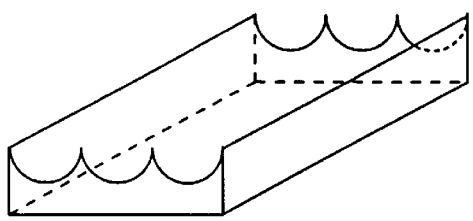
FIG. 3 is a perspective view of a mathematical model used for the surface area gain calculation in the present invention method.

The present invention novel method for improving the storage capacitance by increasing the surface area of an oxide layer which is then reproduced in polysilicon electrode layers can be demonstrated by a mathematical calculation for maximum area gain. In a surface that is polished with grooves such as that shown in FIG. 3, the surface area gain can be calculated as the ratio between the surface area of the etched-back polished film divided by the surface area of the flat surface. This can be expressed as follows:

$$\text{Surface area gain} = \frac{\text{Surface area of the etched-back polished film}}{\text{Surface area of flat surface}}$$
$$= \frac{(\pi a) \times w}{n a \times w}$$
$$= \frac{\pi}{2}$$
$$= 1.57$$

As shown by the equation, the surface area gain by the grooves is calculated at 1.57 times of the original surface area without the grooves. The maximum surface area gain therefore leads to a proportional capacitance gain and improves the storage capacity of the present invention DRAM capacitor.

Figure 4:
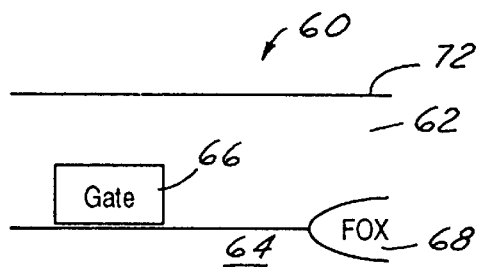
FIG. 4 is an enlarged cross-sectional view of a present inventions structure which has an inter-poly oxide layer deposited on top.

Referring now to FIG. 4, wherein an enlarged, cross-sectional view of a present invention semiconductor structure 60 is shown. The semiconductor structure 60 is constructed by depositing an oxide layer, i.e., an inter-poly oxide layer 62 on a semiconducting substrate 64. The semiconducting substrate 64 is prefabricated with a conductive gate 66 and a field oxide region 68. The inter-poly oxide layer 62 is deposited by a PETEOS (plasma enhanced tetraethoxy silicate) chemistry in a chemical vapor deposition process. A suitable thickness of the oxide layer may be between about 2000 Å and about 20000 Å, and preferably between about 2000 Å and about 10000 Å.

Figure 5:
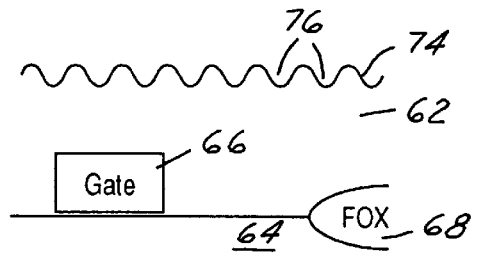
FIG. 5 is an enlarged, cross-sectional view of the present invention structure of FIG. 4 after an uneven top surface is formed on the oxide layer.

In the next step of the process, as shown in FIG. 5, the top surface 72 of the inter-poly oxide layer 62 is made into a zig-zag pattern by a polishing method. The zig-zag pattern or the uneven surface 74 can be created by any suitable means including those of mechanical methods. For instance, a diamond abrasive paper or diamond polishing disk may be advantageously used to create the zig-zag pattern 74 and the individual grooves 76. It should be noted that, when the diamond abrasive paper or the polishing disk is used, the abrasive element should be run on the surface of the oxide only in one stroke such that the individual grooves 76 can be created. A fine grade diamond abrasive paper can be suitably used to create the grooves, as shown in FIG. 5, with a depth (measured from the peak to the valley of the groove) of between about 500 Å and about 1000 Å, preferably between about 500 Å and about 800 Å, and more preferably between about 500 Å and about 700 Å. It should be noted that, other suitable polishing devices other than the diamond abrasive paper and the polishing disk may be suitably used as long as a grooved surface which has the desirable dimension can be produced. Ideally, the grooves 76 should have a minimum depth of at least about 500 Å such that they may be reproduced on the surface of the polysilicon layers that are subsequently deposited on top.

Figure 6:
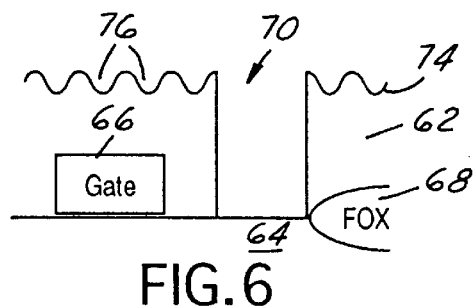
FIG. 6 is an enlarged, cross-sectional view of the present invention structure of FIG. 5 after a capacitor node is formed in the oxide layer.
Figure 7:
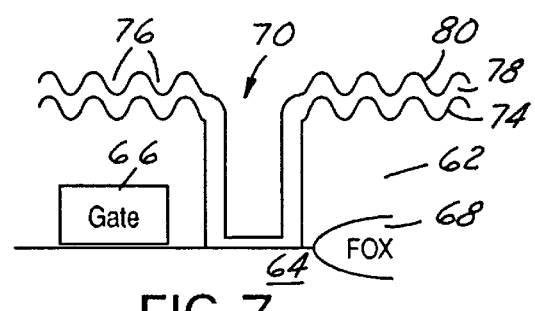
FIG. 7 is an enlarged, cross-sectional view of the present invention structure of FIG. 6 after a first polysilicon layer is deposited on top reproducing the uneven top surface of the oxide layer.

In the next step of the process, as shown in FIG. 6, a capacitor node 70 is formed by an etching method such as a reactive ion etching, or plasma etching process, through the inter-poly oxide layer 62 such that the semiconducting substrate 64 is exposed. This is a standard process in which any etchant that is effective for etching through an oxide layer may be suitably used. After the formation of the node 70, a first polysilicon layer, or the bottom electrode layer 78 is deposited on top of the zig-zag pattern 74 of the oxide layer 62 and in the capacitor node opening 70. A suitable thickness for the first polysilicon layer 78 is between about 500 Å and about 8000 Å while the layer is frequently doped to improve its electrical properties. The polysilicon layer 78 can be deposited by a chemical vapor deposition technique in a conformal coating process wherein the exact contour of zig-zag pattern 74 is reproduced in surface 80 of the polysilicon layer 78. This is shown in FIG. 7.

Figure 8:
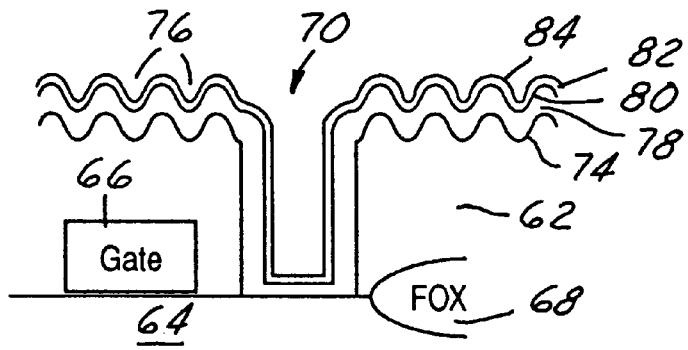
FIG. 8 is an enlarged, cross-sectional view of the present invention structure of FIG. 7 after a dielectric layer is deposited on top reproducing the uneven top surface of the oxide layer.
Figure 9:
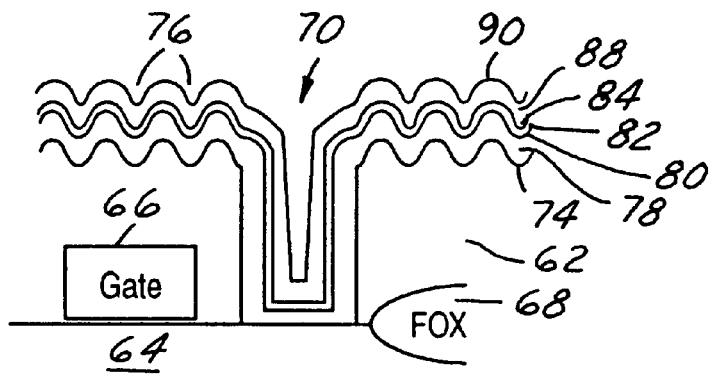
FIG. 9 is an enlarged, cross-sectional view of the present invention structure of FIG. 8 after a second polysilicon layer is deposited on top reproducing the uneven surface of the oxide layer.

In the next step of the process, as shown in FIG. 8, a thin dielectric layer 82 having a thickness in the range of between 50 Å and about 200 Å is deposited on top of the first polysilicon layer 78. A suitable dielectric material for use as the insulating layer in the capacitor structure can be an oxide or an oxide-nitride-oxide (ONO) material, even though other suitable dielectric material may also be used. The zig-zag pattern 80 on the first polysilicon layer 78 is reproduced in a top surface layer 84 of the oxide layer 82 by the conformal coating process for oxide deposition.

A second polysilicon layer 88, doped with the same dopant as the first polysilicon layer 78, is then deposited on top of the dielectric layer 82. A suitable thickness for the second polysilicon layer 88 may be between about 500 Å and about 8000 Å depending on the specific capacitor design. It is to be noted that the same zig-zag pattern 84 on the oxide layer 82 is again reproduced in a top surface 90 of the polysilicon layer 88, even though the pattern may not be as pronounced as that originally found on the oxide layer 62.

Figure 10:
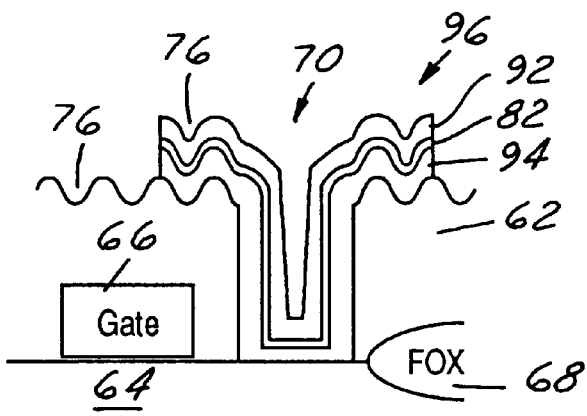
FIG. 10 is an enlarged, cross-sectional view of the present invention structure of FIG. 9 after the DRAM capacitor cell is defined.

In the final fabrication step, as shown in FIG. 10, a conventional photolithographic method and an etching method are used to define the upper and the lower electrodes 92 and 94. For instance, the methods include the steps of defining the DRAM capacitor by an anisotropic etch; using a reactive ion etch or plasma etch as the anisotropic etching process, and using an etch chemistry capable of etching both polysilicon and oxide such as a fluorine-based chemistry or chlorine-based chemistry. A completed DRAM capacitor cell 96 which has improved capacitance due to its increased surface area of the zig-zag pattern is thus produced.

The present invention novel method for forming a DRAM capacitor that has improved charge capacity is therefore amply demonstrated by the above descriptions and the appended drawings FIGS. 3–10. It should be noted that while a specific pattern of grooves formed by a mechanical method, i.e., a polishing method, is illustrated, any other pattern that is capable of increasing the surface area of the polysilicon layers 10 be used. For instance, the grooves may be deeper or shallower and may also be spaced apart at regular or irregular intervals. It should also be noted that while an oxide layer, an inter-poly oxide layer, is used on top of the semiconducting substrate for forming the zig-zag pattern, or the uneven surface, any other suitable insulating layers may also be used as long as its top surface can be easily formed into a zig-zag pattern or any other patterned surface having increased surface area.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for forming a DRAM capacitor comprising the steps of:

depositing an oxide layer on a semiconducting substrate, forming an uneven surface in a top surface of said oxide layer by a polishing method, forming a capacitor node in said oxide layer exposing said substrate, depositing a polysilicon layer on top of said oxide layer and in said node such that said uneven surface on said oxide layer is reproduced in a top surface of said polysilicon layer, depositing a dielectric layer and a second polysilicon layer sequentially on top of said first polysilicon layer reproducing said uneven surface of said oxide layer, and defining said DRAM capacitor.

2. A method according to claim 1 further comprising the step of defining said DRAM capacitor by an anisotropic etching process.

3. A method according to claim 1, wherein said first and second polysilicon layers deposited are doped polysilicon.

4. A method according to claim 1, wherein said first and second polysilicon layers deposited have a thickness between about 500 Å and about 8000 Å.

5. A method according to claim 4, wherein said dielectric layer is deposited of an oxide or an oxide-nitride-oxide material.

6. A method according to claim 2, wherein said anisotropic etching process is conducted by a reactive ion etching process or a plasma etching process.

7. A method according to claim 2, wherein said anisotropic etching process is conducted by an etchant chemistry capable of etching both oxide and polysilicon layers.

8. A method according to claim 2, wherein said anisotropic etching step is conducted by a fluorine-based chemistry or a chlorine-based chemistry.

9. A method according to claim 1, wherein said uneven surface on the oxide layer is formed by a mechanical polishing method.

10. A method according to claim 1, wherein said uneven surface in said top surface of said oxide layer is formed by grooves juxtaposed to each other.

11. A method according to claim 10, wherein said grooves having a diameter of at least 500 Å.

12. A method according to claim 10, wherein said grooves are formed by polishing with a diamond abrasive paper.

13. A method for forming a DRAM capacitor having improved capacitance comprising the steps of:

provoding a semiconducting substrate, depositing an oxide layer on said substrate, forming an uneven surface on top of said oxide layer by a polishing method, forming a capacitor node in said oxide layer, depositing a first polysilicon layer, a dielectric layer, and a second polysilicon layer sequentially on said oxide layer and in said node such that said uneven surface on said oxide layer is reproduced in a top surface of said second polysilicon layer, and reactive ion etching said polysilicon layers and said dielectric layer forming a DRAM capacitor having improved capacitance.

14. A method according to claim 13, wherein said oxide layer is deposited to a thickness of at least 1000 Å as an inter-poly oxide layer.

15. A method according to claim 13, wherein said first and second polysilicon layers deposited are doped polysilicon.

16. A method according to claim 13, wherein said dielectric layer deposited is an oxide or an oxide-nitride-oxide layer.

17. A method according to claim 13, wherein said reactive ion etching is conducted in a plasma etching chamber.

18. A method according to claim 13, wherein said first and said second polysilicon layers deposited are doped polysilicon having a thickness between about 500 Å and about 8000 Å.

19. A method according to claim 13, wherein said uneven surface in said top surface of said oxide layer is formed by grooves juxtaposed to each other.

20. A method according to claim 13, wherein said grooves having a diameter of at least 500 Å.

* * * * *